(12) United States Patent
Tsai et al.

(10) Patent No.: US 7,263,682 B2
(45) Date of Patent: Aug. 28, 2007

(54) SYSTEM AND METHOD FOR CALCULATING TRACE LENGTHS OF A PCB LAYOUT

(75) Inventors: Hung-Yuan Tsai, Tu-Cheng (TW); Han-Chun Ruan, Shenzhen (CN)

(73) Assignees: Hong Fu Jin Precision Industry (ShenZhen) Co., Ltd., Shenzhen, Guangdong (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 277 days.

(21) Appl. No.: 10/977,984

(22) Filed: Oct. 29, 2004

(65) Prior Publication Data

US 2005/0283746 A1    Dec. 22, 2005

(30) Foreign Application Priority Data

Jun. 18, 2004    (TW) ............................... 93117732 A

(51) Int. Cl.
    *G06F 17/50*    (2006.01)
(52) U.S. Cl. ............................ 716/15; 716/12; 716/13; 716/14
(58) Field of Classification Search ............ 716/12–15
    See application file for complete search history.

(56) References Cited

U.S. PATENT DOCUMENTS

| | | | | |
|---|---|---|---|---|
| 4,593,362 A * | 6/1986 | Bergeron et al. ............. | 716/14 |
| 5,050,091 A * | 9/1991 | Rubin ......................... | 716/10 |
| 5,559,997 A * | 9/1996 | Tsuchida et al. ............. | 716/1 |
| 6,256,769 B1 * | 7/2001 | Tamarkin et al. ............. | 716/12 |
| 6,596,549 B2 * | 7/2003 | Kitamura et al. ............. | 438/6 |
| 6,665,846 B2 | 12/2003 | Rein et al. .................... | 716/5 |
| 6,691,290 B1 * | 2/2004 | Wu .............................. | 716/4 |
| 6,779,165 B2 | 8/2004 | Darden ........................ | 716/12 |
| 6,915,249 B1 * | 7/2005 | Sato et al. ................... | 703/14 |

\* cited by examiner

*Primary Examiner*—Jack Chiang
*Assistant Examiner*—Naum Levin
(74) *Attorney, Agent, or Firm*—Frank R. Niranjan

(57) ABSTRACT

A system for calculating trace lengths of a PCB layout includes a computer (10) and a database (11). The computer includes: an object setting module (100) for setting objects to define section rules; a section rule defining module (101) for selecting objects as a start point and an end point for each section in a section rule, and defining a length for the section; a trace selecting module (102) for selecting traces from a trace class; a trace calculating module (103) for calculating all lengths of sections contained in each selected trace and a total length of the selected trace, and determining whether all the selected traces have been calculated; an information generating module (104) for generating corresponding notices if necessary; a storing module (105) for storing the section rules and calculation results; and a calculation result converting module (106) for converting the calculation results into a designated data file.

14 Claims, 5 Drawing Sheets

SYSTEM AND METHOD FOR CALCULATING TRACE LENGTHS OF A PCB LAYOUT

BACKGROUND OF THE INVENTION

1. Field of the Invention

The present invention relates to computer-enabled length calculating systems and methods, and particularly to a system and method for calculating circuit trace lengths of a printed circuit board (PCB) layout.

2. Background of the Invention

Computer chip sizes are continuing to be miniaturized, and electrical signals are being clocked at ever increasing frequencies. Even more that previously, high-speed, high-frequency signals being driven between chips via traces on a PCB are liable to detrimental impedance effects. One manifestation of these impedance effects is unwanted reflections due to impedance mismatches. The high-speed, high-frequency signals may also be prone to cross-talk and electromagnetic interference (EMI).

EMI is an electrical disturbance in an electronics-based system. EMI can be caused by natural phenomena such as lightning, by low-frequency waves emitted from electromechanical devices such as motors, or by high-frequency waves emitted from integrated circuits and other electronic devices such as routers. In the United States, the Federal Communications Commission sets limits on the EMI output of electronic devices. Other countries set their own limits on the EMI output of electronic devices. It is therefore necessary for all parties involved in the fabrication, manufacture, and/or sale of electronic devices to comply with the limitations imposed. In particular, it is necessary for manufactures to ensure that EMI emissions of electronic devices are at or below the maximums imposed in particular jurisdictions.

The length of each trace on a PCB is a parameter affecting EMI emissions. Generally, the EMI emission is directly proportional to the length of the trace. Therefore, when constructing a PCB layout, it is necessary to calculate the length of each trace to insure that the EMI emissions caused by the traces meet the requirements imposed in the relevant jurisdiction(s). Additionally, such calculation should be performed before the final physical layout of the PCB is determined, in order to avoid or minimize the difficult and expensive process of rectifying improper lengths.

Accordingly, there is a need for an inexpensive system and method for calculating trace lengths of a PCB layout, in which calculation is fast and can be performed as early as possible in the design process.

SUMMARY OF THE INVENTION

A main objective of the present invention is to provide a system and method which can efficiently calculate trace lengths of a PCB layout.

To accomplish the above objective, a system for calculating trace lengths of a PCB layout in accordance with a preferred embodiment of the present invention comprises a databa, and a computer connected to the database. The database is for storing objects of the PCB, section rules and trace information. The computer is for calculating a length of each of sections of each trace and a total length of the trace, and generating corresponding notices if necessary. The computer comprises an object setting module, a section rule defining module, a trace selecting module, a trace calculating module, an information generating module, a storing module, and a calculation result converting module.

The object setting module is for setting objects to define section rules. The section rule defining module is for selecting an object as a start point and an object as an end point for each section in a section rule, and defining a length for the section. The trace selecting module is for selecting one or more traces from a trace class. The trace calculating module is for calculating all section lengths contained in each trace and a corresponding total length of each trace, and determining whether all the selected traces have been calculated. The information generating module is for generating corresponding notices if necessary. When any section length or a total length of a standard trace does not accord with its respective predefined length, the information generating module generates a notice requiring redefining of a section rule. Alternatively, when any segment of a selected trace does not accord with the section rule, the information generating module generates a notice of not being able to calculate any length. The storing module is for storing the section rules and calculation results in the database. The calculation result converting module is for converting the calculation results into a designated data file.

Further, the present invention provides a method for calculating trace lengths of a PCB layout, the method comprising the steps of: (a) setting a plurality of objects selected from a database; (b) defining a section rule for a trace class, and storing the defined section rule in the database; (c) calculating each section length contained in a standard trace, and calculating a total length of the standard trace; (d) generating a notice requiring redefining of the section rule, if a length of any section or the total length of the standard trace does not accord with its respective predefined length; (e) selecting one or more traces from the trace class, if all lengths of sections and the total length of the standard trace accord with their respective predefined lengths; (e) calculating a length of any section and a total length of each selected trace, and storing calculation results in the database; and (f) converting the calculation results into a designated data file, if all the selected traces have been calculated.

Other objects, advantages and novel features of the present invention will be drawn from the following detailed description with reference to the attached drawings, in which:

DETAILED DESCRIPTION OF THE INVENTION

Figure 1:
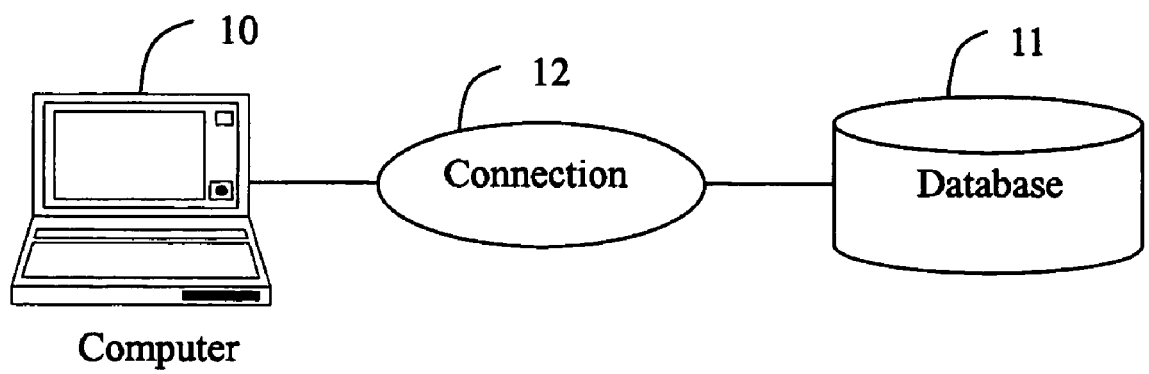
FIG. 1 is a block diagram of hardware infrastructure of a system for calculating trace lengths of a PCB layout in accordance with the preferred embodiment of the present invention.

FIG. 1 is a block diagram of hardware infrastructure of a system for calculating trace lengths of a printed circuit board (PCB) layout (hereinafter, "the system") in accordance with the preferred embodiment of the present invention. The system comprises a computer 10, a database 11, and a connection 12. The computer 10 contains a plurality of function modules installed therein. The computer 10 calculates a length of each of sections contained in each of traces of the PCB and a total length of each trace, and generates corresponding notices if necessary. In the preferred embodiment, each trace consists of a plurality of segments, and each segment contains start and end coordinates. Each trace is either a standard trace or a trace to be calculated. The standard trace is a satisfactory trace which meets a design rule check (DRC) standard, and is used to validate a section rule. The section rule specifies a start point and an end point for each section of a trace class, and a length for the section. The section may contain one or more segments. After being validated by the standard trace, the section rule is regarded as a fixed and reasonable section rule. When a length of any section contained in a standard trace or a total length of the standard trace does not accord with its predefined length in a corresponding predefined section rule, the computer 10 generates a notice requiring redefining of the section rule. When any segment of a trace to be calculated does not accord with a corresponding section rule, the computer 10 generates a notice of not being able to calculate any length. This occurs when coordinates of the segment are not in a coordinate interval of any section defined in the section rule.

The database 11 stores information on objects of the PCB, section rules, and trace information. The objects may be components mounted on the PCB, such as a north bridge, double inline memory modules (DIMMs), capacitors and the like. The objects may also be other parts on the PCB, such as a pin, a via, a boundary, a layer change, a width change, a branch and the like. Each section (symbolically designated as section 'a,' section 'b,' section 'c,' etc.) starts at a start point and ends at an end point, with the section having corresponding coordinates. The start point and end point of the section can each be a respective object. However, the start point and end point of a trace can each only be a component. Generally, the end point of a section is also the start point of a following section. For example, if section 'a' starts at a north bridge and ends at a DIMM, the following section 'b' starts at the DIMM and ends at another object such as a capacitor. The trace information includes a trace class, a trace ID, segments of the trace, segment IDs, and start point coordinates and end point coordinates of each segment. The trace class may be any one of an address trace class, a clock trace class, a common trace class, a data trace class, and an "other" trace class. Each trace class corresponds to a certain section rule, and includes a plurality of traces containing standard traces and traces to be calculated. The connection 12 is a kind of database connectivity such as an open database connectivity (ODBC) or a Java database connectivity (JDBC), and is for connecting the computer 10 to the database 11.

Figure 2:
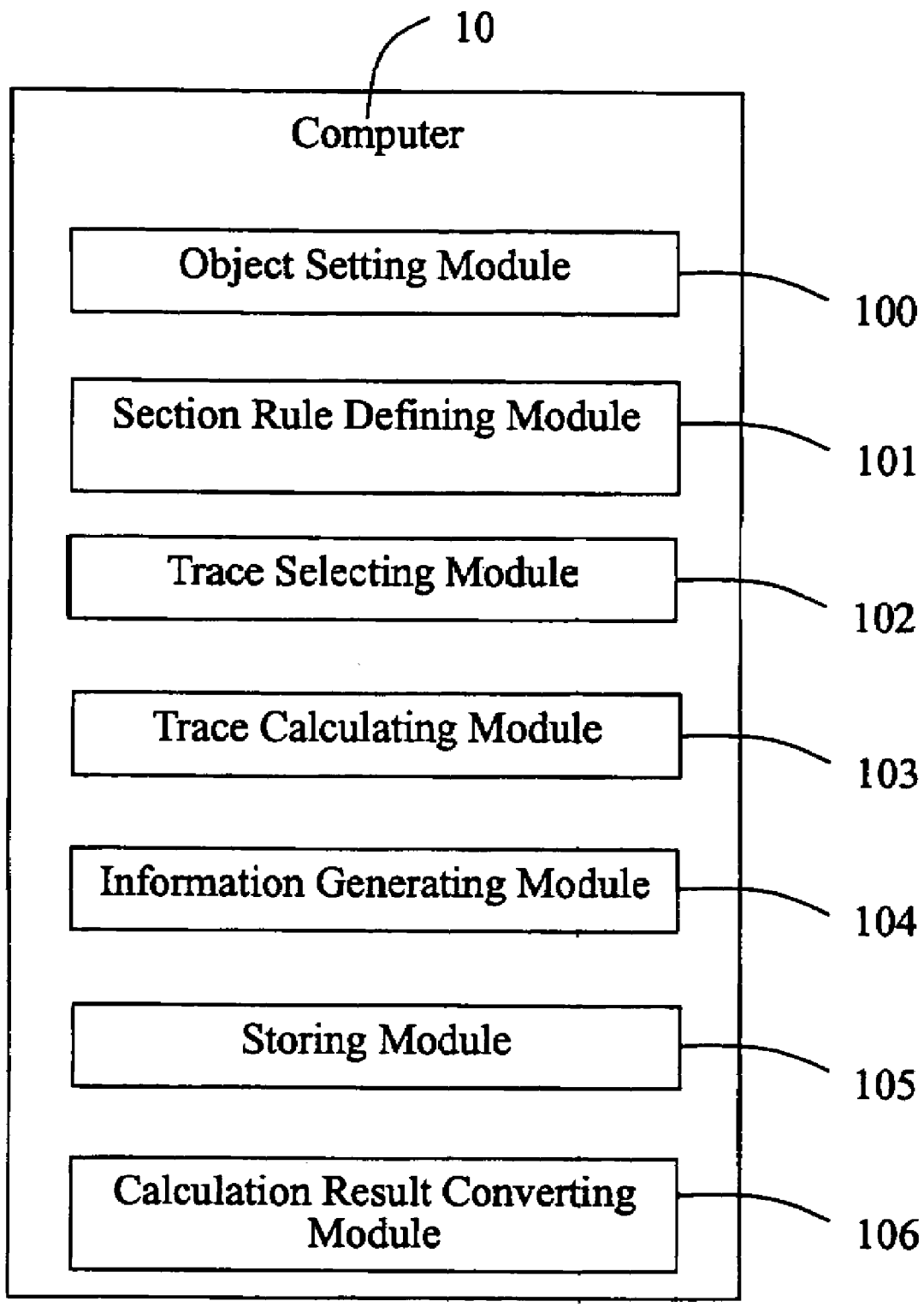
FIG. 2 is a schematic diagram of main function modules of a computer of the system of FIG. 1.

FIG. 2 is a schematic diagram of main function modules of the computer 10. The computer 10 comprises an object setting module 100, a section rule defining module 101, a trace selecting module 102, a trace calculating module 103, an information generating module 104, a storing module 105, and a calculation result converting module 106. The object setting module 100 sets objects to be used to define section rules. The section rule defining module 101 selects an object as a start point and an object as an end point for each section in a section rule, and defines a length for the section. For example, the section rule defining module 101 selects two components (symbolically designated as component 'c1' and component 'c2') for a trace class such as an address trace class, and defines the component 'c1' as a start point and the component 'c2' as an end point in the section rule for the address trace class. For simplicity, only three sections are contained in the section rule: section 'a,' section 'b,' and section 'c.' The section rule defining module 101 defines the component 'c1' as a start point of section 'a,' and selects an object such as a boundary 'm' as an end point of section 'a.' Then, the section rule defining module 101 defines the boundary 'm' as a start point of section 'b,' and sets another object such as a pin 'n' as an end point of section 'b.' Therefore, section 'c' starts at the pin 'n' and ends at the component 'c2.' The trace selecting module 102 selects one or more traces from the address trace class. The selected traces are organized in sequence according to their trace IDs.

The trace calculating module 103 calculates lengths of various sections in each selected trace and a total length of the selected trace, and determines whether all the selected traces have been calculated. When a length of any section in a standard trace or a total length of the standard trace does not accord with its predefined length in a corresponding section rule, the information generating module 103 generates a notice requiring redefining of the section rule. Any segment of a trace to be calculated does not accord with a corresponding section rule if coordinates of the segment are not in a coordinate interval of any section. In such case, the information generating module 104 generates a notice of not being able to calculate any length. The storing module 105 stores the section rules and calculation results in the database 11. The calculation result converting module 106 converts the calculation results into a designated data file. The data file may be a Microsoft Excel format file, or another kind of data file.

Figure 3:
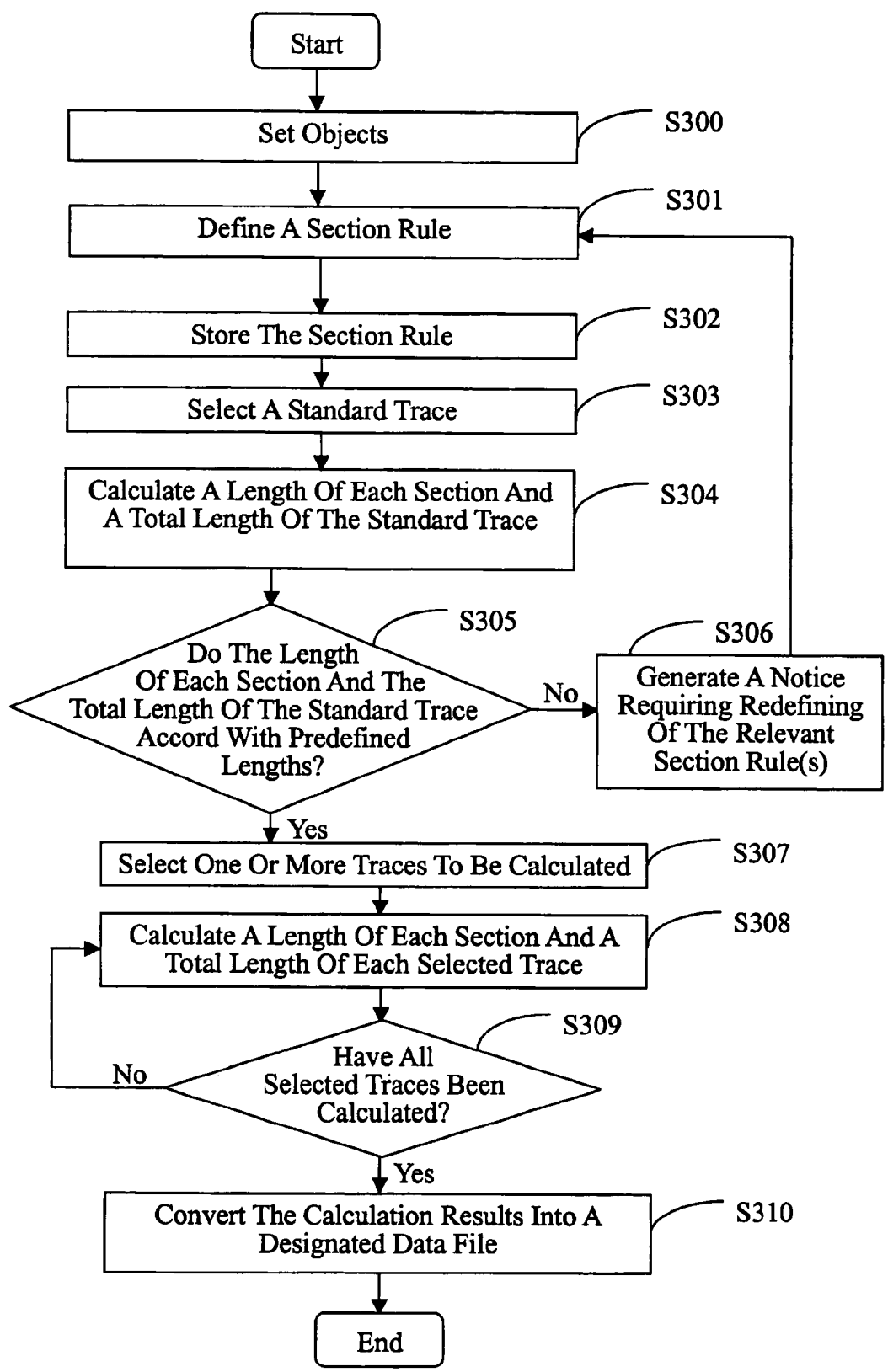
FIG. 3 is a flowchart of a preferred method for implementing the system of FIG. 1.

FIG. 3 is a flowchart of a preferred method for implementing the system. In step S300, the object setting module 100 sets a plurality of objects selected from the database 11 to define a particular section rule for a trace class such as an address trace class. In step S301, the section rule defining module 101 defines the section rule by selecting an object as a start point and an object as an end point for each section of the trace class, and specifying a length for each section and a total length for each address trace. In step S302, the storing module 105 stores the defined section rule in the database 11. In step S303, the trace selecting module 103 selects a standard trace from the address trace class. In step S304, the trace calculating module 103 calculates a length of each section contained in the selected standard trace, and calculates a total length of the selected standard trace. The storing module 105 stores the lengths of the sections and the total length of the selected standard trace in the database 11. In step S305, the information generating module 104 determines whether the length of each section and the total length of the selected standard trace accord with their respective predefined lengths in the section rule. If a length of any section or the total length of the selected standard trace does not accord with its predefined length, in step S306, the information generating module 104 generates a notice requiring redefining of the relevant section rule. This means that the defined section rule is unreasonable. Thereupon the procedure returns to step S301 described above.

If all lengths of the sections and the total length of the selected standard trace accord with their respective predefined lengths, in step S307, the trace selecting module 102 selects one or more traces to be calculated from the address trace class, and organizes the traces in sequence according to their trace IDs. In step S308, the trace calculating module 103 calculates a length of each section contained in each selected trace and a total length of the selected trace. Then the storing module 105 stores calculation results in the database 11. In step S309, the trace calculating module 103 determines whether all the selected traces and their sections have been calculated. If there is any selected trace or section which has not been calculated, the procedure returns to step S308 described above. In contrast, if all the selected traces and their sections have been calculated, in step S310, the calculation result converting module 106 converts the calculation results from a database data file into a designated data file. The designated data file may, for example, be a Microsoft Excel format file.

Figure 4:
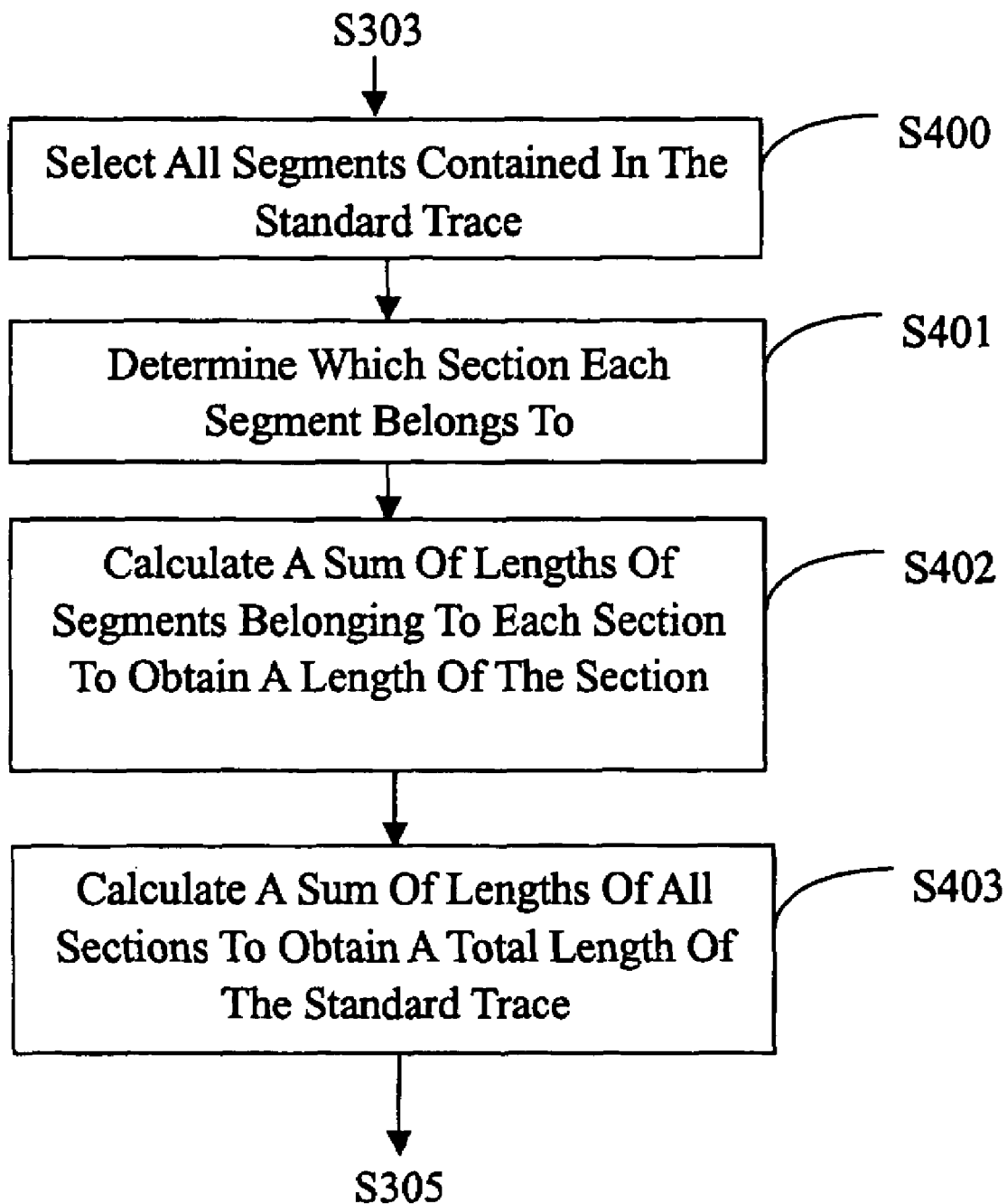
FIG. 4 is a flowchart of implementing one step of FIG. 3, namely calculating a length of each section contained in a standard trace and a total length of the standard trace.

FIG. 4 is a flowchart of implementing step S304 of FIG. 3, namely calculating a length of each section contained in the selected standard trace and a total length of the selected standard trace. In step S400, the trace calculating module 103 selects all segments contained in the selected standard trace from the database 11. Each segment has a segment ID, and start and end coordinates. In step S401, the trace calculating module 103 retrieves all sections defined in the section rule, and determines which section each segment belongs to, according to the start and end coordinates of the segment and coordinates of the sections. When one part of the segment is in one section and the other part of the segment is in another section, the segment is regarded as belonging to different sections. In step S402, the trace calculating module 103 calculates a sum of lengths of segments belonging to each section to obtain a length of the section. In step S403, the trace calculating module 103 calculates a sum of lengths of all sections to obtain a total length of the selected standard trace.

Figure 5:
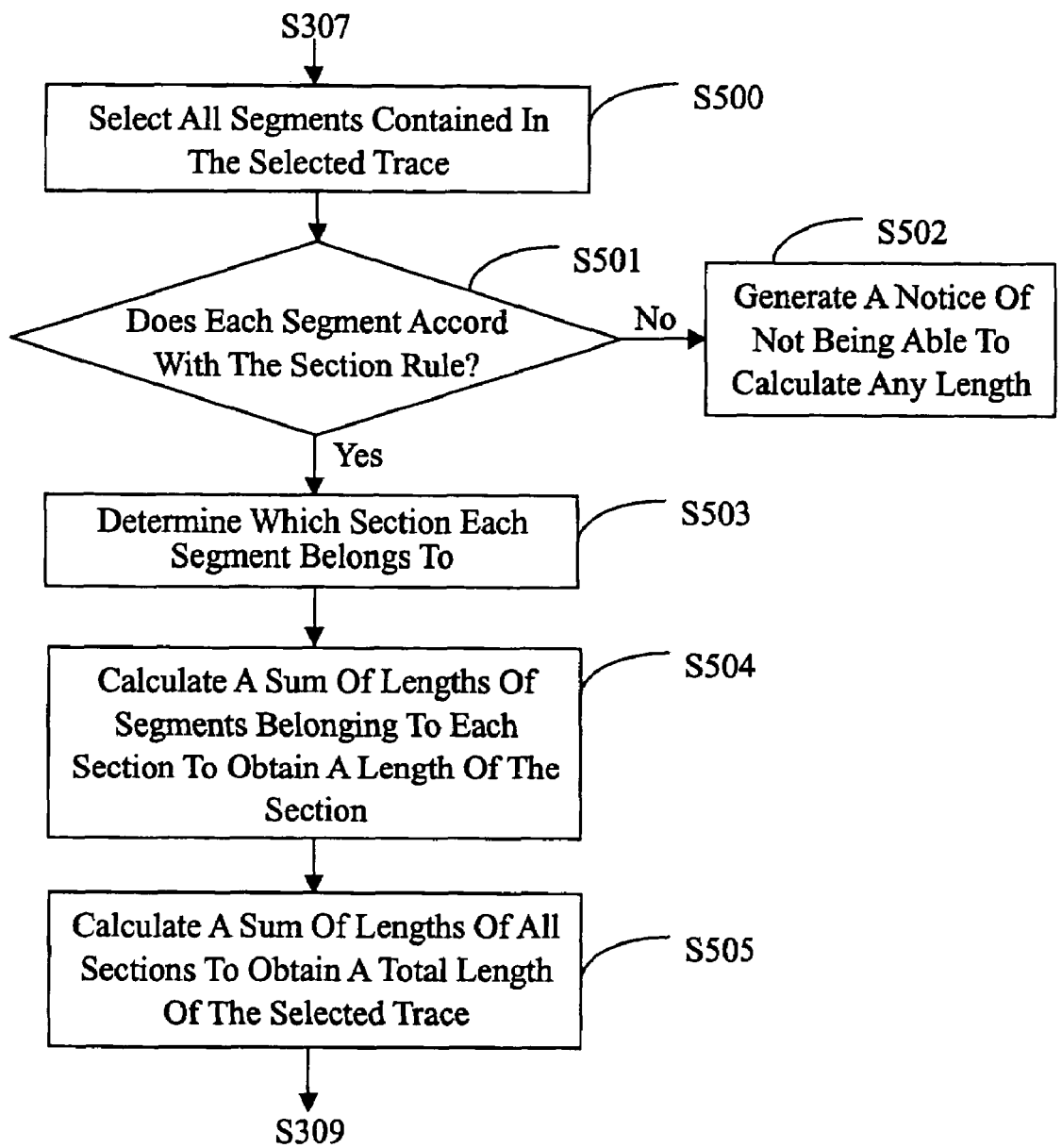
FIG. 5 is a flowchart of implementing another step of FIG. 3, namely calculating a length of each section contained in a selected trace and a total length of the selected trace.

FIG. 5 is a flowchart of implementing step S308 of FIG. 3, namely calculating a length of each section contained in a selected trace and a total length of the selected trace. In step S500, the trace calculating module 103 selects all segments contained in the selected trace from the database 11. Each segment has a segment ID, and start and end coordinates. In step S501, the trace calculating module 103 retrieves all sections defined in the section rule, and determines whether each segment of the selected trace accords with the section rule, according to the start and end coordinates of the segment and coordinates of the sections. If any segment does not accord with the section rule, namely, the segment does not belong to any section according to the section rule, in step S502, the information generating module 104 generates a notice of not being able to calculate any length. If all segments accord with the section rule, in step S503, the trace calculating module 103 determines which section each segment belongs to. When one part of the segment is in one section and the other part of the segment is in another section, the segment is regarded as belonging to different sections. In step S504, the trace calculating module 103 calculates a sum of lengths of segments belonging to each section to obtain a length of the section, and the storing module stores the calculation results in the database 11. In step S505, the trace calculating module 103 calculates a sum of lengths of all sections to obtain a total length of the selected trace, and the storing module 105 stores the calculation results in the database 11.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for calculating trace lengths of a printed circuit board (PCB) layout, comprising:
    a database for storing information on objects of the PCB, section rules, and trace information; and
    a computer connected to the database, for calculating a length of each section contained in each trace and a total length of the trace, and generating corresponding notices if necessary, the computer comprising;
        an object setting module for setting objects to be used to define section rules;
        a section rule defining module for selecting an object as a start point and an object as an end point for each section in a section rule, and defining a length for the section;
        a trace selecting module for selecting one or more traces from a trace class;
        a trace calculating module for calculating lengths of various sections contained in each selected trace and a total length of the selected trace, and determining whether all the selected traces have been calculated;
        an information generating module for generating a notice requiring redefining of a relevant section rule when a length of any section in a standard trace of the trace class or a total length of the standard trace does not accord with its predefined length, and generating a notice of not being able to calculate any length when any segment of a trace to be calculated does not accord with a corresponding determined section rule, wherein the standard trace is a satisfactory trace that meets a design rule check standard in the trace class;
        a storing module for storing the defined section rules and calculation results in the database; and
        a calculation result converting module for converting the calculation results into a designated data file.

2. The system for calculating trace lengths of a PCB layout according to claim 1, wherein each section rule comprises one or more sections.

3. The system for calculating trace lengths of a PCB layout according to claim 1, wherein the objects comprise any one or more of components, vias, boundaries, layer changes, width changes, and branches.

4. The system for calculating trace lengths of a PCB layout according to claim 1, wherein the trace information comprises a trace class, a trace ID, segments of the trace, segment IDs, and start and end coordinates of each segment.

5. The system for calculating trace lengths of a PCB layout according to claim 1, wherein an end point of a section is a start point of a following section.

6. The system for calculating trace lengths of a PCB layout according to claim 1, wherein the trace class is any one of an address trace class, a clock trace class, a common trace class, a data trace class, and an 'other' trace class.

7. The system for calculating trace lengths of a PCB layout according to claim 1, wherein the standard trace is a satisfactory trace which meets a design rule check (DRC) standard, and is used to validate a section rule.

8. A computer-based method for calculating trace lengths of a printed circuit board (PCB) layout, the method comprising the steps of:
    setting a plurality of objects selected from a database;
    defining a section rule for a trace class, and storing the defined section rule in the database;
    calculating a length of each section contained in a standard trace, and calculating a total length of the standard wave;
    generating a notice requiring redefining of the section rule, if a length of any section in the standard trace or the total length of the standard trace does not accord with its predefined length in the section rule;

selecting one or more traces to be calculated from the trace class, if all lengths of the sections in the standard trace and the total length of the standard trace accord with their predefined lengths in the section rule;

calculating a length of each section contained in each selected trace and a total length of the selected trace, and storing calculation results in the database; and converting the calculation results into a designated data file, if all the selected traces have been calculated.

9. The method according to claim 8, further comprising the step of:

returning to the step of calculating a length of each section contained in each selected trace and a total length of the selected trace, if there are any selected traces that have not been calculated.

10. The method according to claim 8, wherein the step of calculating a length of each section contained in a standard trace and calculating a total length of the standard trace comprises the steps of:

selecting all segments contained in the standard trace and determining which section each segment belongs to;

calculating a sum of lengths of segments belonging to each section to obtain a length of the section; and calculating a sum of lengths of all sections to obtain a total length of the standard trace.

11. The method according to claim 8, wherein the step of calculating a length of each section contained in a selected trace and a total length of the selected trace comprises the steps of:

selecting all segments contained in the selected trace, wherein each segment comprises start and end coordinates;

determining whether each segment accords with the section rule, according to the start and end coordinates;

generating a notice of not being able to calculate any length, if any segment does not accord with the section rule;

determining which section each segment belongs to, if all segments accord with the section rule;

calculating a sum of lengths of segments belonging to each section to obtain a length of the section; and calculating a sum of lengths of all sections to obtain a total length of the selected trace.

12. A computer-based method for calculating lengths of a trace layout of a circuit board, comprising the steps of:

defining a section rule of a specialized section based on objects of said circuit board and a trace class of a selective trace of said circuit board, and storing said section rule in a database;

selecting a standard trace of said trace class from said database, and calculating section length values of said standard trace based on said section rule and identification of said specialized section from said standard trace;

modifying said section rule in case of disaccord between any of said section length values of said standard trace and defined length values according to said section rule;

identifying segments of said selective trace according to said section rule, and reporting any of said segments in case of disaccord between said any of said segments and said specialized section according to said section rule; and calculating segment length values of said selective trace, and recording said segment length values in said database.

13. The method according to claim 12, further comprising a step of:

converting said segment length values into a designated data file.

14. The method according to claim 12, further comprising a step of:

storing said section rule as modified in said database after said section rule is modified in case of disaccord between any of said section length values of said standard trace and defined length values according to said section rule.

* * * * *